United States Patent
Agarwal et al.

(10) Patent No.: US 7,345,310 B2
(45) Date of Patent: Mar. 18, 2008

(54) SILICON CARBIDE BIPOLAR JUNCTION TRANSISTORS HAVING A SILICON CARBIDE PASSIVATION LAYER ON THE BASE REGION THEREOF

(75) Inventors: Anant K. Agarwal, Chapel Hill, NC (US); Sumithra Krishnaswami, Morrisville, NC (US); Sei-Hyung Ryu, Cary, NC (US); D. Craig Capell, Durham, NC (US)

(73) Assignee: Cree, Inc., Durham, NC (US)

( * ) Notice: Subject to any disclaimer, the term of this patent is extended or adjusted under 35 U.S.C. 154(b) by 21 days.

(21) Appl. No.: 11/315,672

(22) Filed: Dec. 22, 2005

(65) Prior Publication Data

US 2007/0145378 A1  Jun. 28, 2007

(51) Int. Cl.
*H01L 29/15* (2006.01)
*H01L 31/0312* (2006.01)

(52) U.S. Cl. .......................................... 257/77; 257/197
(58) Field of Classification Search .................. 257/77, 257/197
See application file for complete search history.

(56) References Cited

U.S. PATENT DOCUMENTS

| | | | |
|---|---|---|---|
| 4,912,064 A | 3/1990 | Kong et al. | |
| 4,945,394 A | 7/1990 | Palmour et al. | |
| 5,011,549 A | 4/1991 | Kong et al. | |
| 5,298,439 A | 3/1994 | Liu et al. | |
| 5,323,022 A | 6/1994 | Glass et al. | |
| 5,409,859 A | 4/1995 | Glass et al. | |
| 5,473,172 A * | 12/1995 | Nii .............................. | 257/183 |
| 5,780,880 A | 7/1998 | Enquist | |
| 6,218,254 B1 | 4/2001 | Singh et al. | |
| 6,239,820 B1 * | 5/2001 | Figueredo et al. ............ | 347/50 |
| 6,395,608 B2 | 5/2002 | Shin et al. | |
| 6,462,362 B1 | 10/2002 | Miyoshi | |
| 6,764,907 B2 | 7/2004 | Van Zeghbroeck et al. | |
| 2001/0048120 A1 | 12/2001 | Shimawaki | |
| 2003/0089992 A1 * | 5/2003 | Rathi et al. .................. | 257/762 |
| 2003/0098465 A1 | 5/2003 | Suzumura et al. | |
| 2003/0102533 A1 * | 6/2003 | Siegel et al. ................. | 257/642 |
| 2003/0160302 A1 | 8/2003 | Sankin et al. | |
| 2004/0041235 A1 | 3/2004 | Yanagihara et al. | |
| 2005/0184295 A1 * | 8/2005 | Huang et al. .................. | 257/77 |
| 2005/0260821 A1 | 11/2005 | Van Zeghbroeck et al. | |

OTHER PUBLICATIONS

U.S. Appl. No. 11/229,476, filed Sep. 16, 2005, Das et al.
U.S. Appl. No. 11/229,474, filed Sep. 16, 2005, Agarwal et al.

(Continued)

*Primary Examiner*—Jerome Jackson
*Assistant Examiner*—Anthony Ho
(74) *Attorney, Agent, or Firm*—Myers Bigel Sibley & Sajovec, P.A.

(57) ABSTRACT

A bipolar junction transistor (BJT) includes a silicon carbide (SiC) collector layer of first conductivity type, an epitaxial silicon carbide base layer of second conductivity type on the silicon carbide collector layer, and an epitaxial silicon carbide emitter mesa of the first conductivity type on the epitaxial silicon carbide base layer. An epitaxial silicon carbide passivation layer of the first conductivity type is provided on at least a portion of the epitaxial silicon carbide base layer outside the silicon carbide emitter mesa. The epitaxial silicon carbide passivation layer can be configured to fully deplete at zero device bias. Related fabrication methods also are disclosed.

16 Claims, 8 Drawing Sheets

OTHER PUBLICATIONS

Harris, J.S. "Outline of Today's Materials" *EE328 Physics of Advanced Semiconductor Devices* (*Spring 2004*), Stanford University, <http://www.stanford.edu/class/ee328/EE328_Lecture11_5_4_04.pdf>.

"Improving the Reliability of InP HBTs With a Ledge Structure." *Research at Photonics Laboratories* (*High-Speed Electronics Circuit and Device II*). Sep. 13, 2003. NTT Photonic Laboratories. Mar. 29, 2006 <http://www.phlab.ecl.ntt.co.jp/eng/theme/2005/e2005_09_01.pdf>.

Communication with European Search Report, EP 06126735.7, Apr. 24, 2007.

* cited by examiner

US 7,345,310 B2

1

SILICON CARBIDE BIPOLAR JUNCTION TRANSISTORS HAVING A SILICON CARBIDE PASSIVATION LAYER ON THE BASE REGION THEREOF

STATEMENT OF GOVERNMENT INTEREST

This invention was made with Government support under contract number W911NF-04-2-0022 awarded by the U.S. Army Research Laboratory (ARL). The Government has certain rights in this invention.

FIELD OF THE INVENTION

This invention relates to power semiconductor devices and related methods of fabricating power semiconductor devices and, more particularly, to silicon carbide power devices and related methods of fabricating silicon carbide power devices.

BACKGROUND OF THE INVENTION

Power devices are widely used to carry large currents and/or support high voltages. Conventional power devices are generally fabricated from monocrystalline silicon semiconductor material. One type of power device is the bipolar junction transistor (BJT). The BJT is a well-known and frequently used power device. A BJT typically includes a semiconductor material having two opposing p-n junctions in close proximity to one another. Thus, BJTs may be referred to as "n-p-n" or "p-n-p" transistors.

In operation, current carriers enter a region of the semiconductor material of a first conductivity type adjacent one of the p-n junctions, which is called the emitter. Most of the charge carriers exit the device from a region of the semiconductor material of the first conductivity type adjacent the other p-n junction, which is called the collector. A small portion of semiconductor material known as the base, having a second conductivity type, opposite the first conductivity type of the collector and the emitter, is positioned between the collector and the emitter. The two p-n junctions of the BJT are formed where the collector meets the base and where the base meets the emitter.

When current is injected into or extracted from the base, depending upon whether the BJT is n-p-n or p-n-p, the flow of charge carriers, i.e., electrons or holes, which can move from the emitter to the collector, may be affected. Typically, small currents applied to the base can control proportionally larger currents passing through the BJT, giving it usefulness as a component of electronic circuits. Structural and operational details of BJT's are discussed in *Solid State Electronic Devices* by B. Streetman (2nd edition (1980), chapter 7), the content of which is incorporated herein by reference as if set forth in its entirety.

The material that makes up a device can contribute to the operability and usefulness of the device. For example, conventional BJTs are typically formed of silicon (Si), but can also include gallium arsenide (GaAs) and indium phosphide (InP). Silicon carbide (SiC) has also been used as a material for BJTs. SiC has potentially advantageous semiconductor characteristics, for example, a wide bandgap, high electric field breakdown strength, high thermal conductivity, high melting point and high-saturated electron drift velocity. Thus, relative to devices formed in other semiconductor materials, for example, Si, electronic devices formed in SiC may have the capability of operating at higher temperatures,

2 at high power densities, at higher speeds, at higher power levels and/or under high radiation densities.

Due to their ability to function at high frequencies, high temperatures, and/or high power levels, SiC transistors can be highly desirable for use in applications such as high frequency transmitters for radar and communications, for high power switching applications, and for high temperature operations such as jet engine control. Accordingly, methods of producing device quality SiC and devices formed from SiC have been of interest to scientists and engineers for several decades.

SiC crystallizes in over 150 different polytypes, or crystal structures, of which the most common are designated 3C, 4H, and 6H where "C" stands for "cubic" and "H" for "hexagonal." SiC generally is a difficult material to use in semiconductor devices. In particular, the high melting point of SiC may render techniques, such as alloying and diffusion of dopants, more difficult, because a number of the other materials necessary to perform such operations may tend to break down at the high temperatures used to affect SiC. SiC is also an extremely hard material, and indeed a common use for SiC is as an abrasive. Notwithstanding these potential difficulties, junctions, diodes, transistors, and other devices have been fabricated from SiC.

SiC BJTs are discussed in, for example, U.S. Pat. No. 4,945,394 to Palmour et al., the disclosure of which is incorporated herein by reference as if set forth in its entirety. As discussed therein, SiC BJTs have a base and an emitter formed as wells using high temperature ion implantation. Furthermore, SiC BJTs are also discussed in U.S. Pat. No. 6,218,254 to Singh et al., the disclosure of which is incorporated herein by reference as if set forth in its entirety. As discussed therein, SiC BJTs having a base and an emitter are formed using epitaxial growth and high temperature ion implantation. Singh further discusses the use of removable dielectric spacers to improve the alignment of base and emitter regions.

SiC BJTs may also include at least one highly doped implant region for the base and/or the emitter. The formation of the implant region may cause damage to the SiC crystal. For example, the current gain of the device may be reduced due to surface recombination current due to implant-induced defects. The current gain of the device may be reduced as a function of time due to stacking faults in the base region, which may result from the defects created by the implantation process. Furthermore, the highly doped emitter regions present in these devices may have a poor lifetime, which may further reduce the current gain of the device.

Referring now to FIG. 1, a cross section of a conventional SiC BJT will be discussed. As illustrated in FIG. 1, an N⁻ SiC epitaxial (epi) collector layer 116 is provided on a highly doped N⁺ SiC substrate 114. The N⁺ SiC substrate 114 and the N⁻ SiC epi collector layer 116 can define a collector 110 for the device. A p-type (P) SiC epi base layer 120 is provided on the N⁻ SiC epi collector layer 116. As further illustrated in FIG. 1, an n-type epi emitter mesa 130 (N⁺) is provided on the p-type SiC base layer 120. The emitter mesa 130 may be formed by selective epitaxial growth and/or epitaxial growth and subsequent etching. Moreover, highly doped (P⁺) regions 124 may be formed in the base layer 120 by implantation techniques. In particular, the implantation of the P⁺ base regions 124 may be carried out at from about 650° C. to about 1100° C. using aluminum ions (Al⁺) having energy ranging from about 20 keV to about 360 keV. As discussed above, this implant may cause damage to the SiC crystal, which may not be entirely removed by a high temperature (1600-1700° C.) activation anneal.

In particular, the defects introduced by the implant may result in surface recombination current and stacking fault formation in the base layer of the device. This relationship is represented by the equation:

$$\beta = i_C/i_B$$

where β represents current gain, $i_C$ represents collector current and $i_B$ represents base current. Base current $i_B$ may be further represented by $$i_B = i_{Br} + i_{Bi} + i_{Bsr};$$

where $i_{Br}$ is recombination current, $i_{Bi}$ represents majority carriers injected across the emitter junction, and $i_{Bsr}$ represents surface recombination current. Current gain may be represented by the equation:

$$\beta = i_C/(i_{Br} + i_{Bi} + i_{Bsr}).$$

Accordingly, any increase in surface recombination current $i_{Bsr}$ in the base region may yield a lower current gain for the device.

Referring again to FIG. 1, a dielectric passivation layer 140 is provided on the surface of the device. The dielectric passivation layer 140 may comprise silicon dioxide and/or silicon nitride. The BJT further includes base (B) contacts 122, an emitter (E) contact 132 and a collector (C) contact 112. The highly doped regions designated as N⁺ 114, 130 and P⁺ 124 may be provided to improve the quality of the ohmic contacts. The base emitter and collector contacts 122, 132 and 112, respectively, may include multilayer structures including ohmic metal and/or overlaying layer metals. It will also be understood that other embodiments of bipolar transistors may eliminate one or more of the layers and/or regions shown in FIG. 1, or may add additional regions and/or layers.

Unfortunately, it has been found that the current gain of SiC BJTs, such as illustrated in FIG. 1, may degrade over time under typical operating conditions. In particular, FIGS. 2A-2D illustrate output characteristics of an SiC BJT with increasing cumulative stress at 10 A for 0 minutes, 15 minutes, 30 minutes and 16 hours, respectively. Current gain degradation is shown within 15 minutes of operation and continued degradation is shown by the succeeding output characteristics of FIGS. 2A-2D.

SUMMARY OF THE INVENTION

Bipolar junction transistors (BJTs) according to some embodiments of the present invention include a silicon carbide collector layer of first conductivity type, an epitaxial silicon carbide base layer of second conductivity type different than the first conductivity type on the silicon carbide collector layer, and an epitaxial silicon carbide emitter mesa of the first conductivity type on the epitaxial silicon base layer remote from the silicon carbide collector layer. An epitaxial silicon carbide passivation layer of the first conductivity type is provided on at least a portion of the epitaxial silicon carbide base layer outside the silicon carbide emitter mesa.

In some embodiments, the epitaxial silicon carbide passivation layer of the first conductivity type has a carrier concentration of the first conductivity type and is of a thickness, wherein the carrier concentration and thickness are selected to fully deplete the epitaxial silicon carbide passivation layer by the epitaxial silicon carbide base layer, at zero bias on the bipolar junction transistor. More specifically, in some embodiments, the silicon carbide passivation layer of the first conductivity type has a carrier concentration C of the first conductivity type, and is of a thickness T that is selected according to the following equation:

$$\frac{qCT^2}{2\varepsilon_s} \leq 2.7,$$

where q is the elementary charge, and $\varepsilon_s$ is the permittivity of silicon carbide.

The epitaxial silicon carbide passivation layer may have various extents on the base layer, and may extend onto the emitter mesa, according to various embodiments of the present invention. For example, in some embodiments, the epitaxial silicon carbide emitter mesa includes a top that is remote from the epitaxial silicon carbide base layer, and a sidewall that extends between the top and the epitaxial silicon carbide base layer. In some embodiments, the epitaxial silicon carbide passivation layer extends on at least a portion of the epitaxial silicon carbide base layer outside the silicon carbide mesa, but not on the sidewall. In other embodiments, the epitaxial silicon carbide passivation layer also extends on the sidewall but not on the top. In still other embodiments, the epitaxial silicon carbide passivation layer extends on the top as well.

Moreover, various extents may be provided for the epitaxial silicon carbide passivation layer of the first conductivity type on the silicon carbide base layer. In particular, in some embodiments, the silicon carbide base layer includes a first portion and a second portion of higher carrier concentration than the first portion that is spaced apart from the emitter mesa. In some embodiments, the epitaxial silicon carbide passivation layer extends on the epitaxial silicon carbide base layer from adjacent the silicon carbide mesa to adjacent the second portion. In other embodiments, the epitaxial silicon carbide passivation layer extends from adjacent the silicon carbide emitter mesa to the second portion. In still other embodiments, the passivation layer extends from the silicon carbide emitter mesa to adjacent the second portion. In yet other embodiments, the passivation layer extends from the silicon carbide mesa to the second portion. The second portion of the base layer may be formed by an implant in the first portion that is spaced apart from the emitter mesa, and/or may be an epitaxial base mesa on the first portion that is spaced apart from the emitter mesa.

In still other embodiments, a dielectric passivation layer may be provided on the epitaxial silicon carbide passivation layer, remote from the epitaxial silicon carbide base layer. The dielectric passivation layer may comprise silicon dioxide. Moreover, in some embodiments, the epitaxial silicon carbide emitter mesa can include a first portion adjacent the epitaxial silicon carbide base layer, and a second portion on the first portion and remote from the epitaxial silicon carbide base layer, wherein the second portion has higher carrier concentration than the first portion. Finally, in still other embodiments, collector, base and emitter contacts may be provided using single layer and/or multilayer structures.

Bipolar junction transistors may be fabricated according to various embodiments of the present invention by epitaxially growing a silicon carbide base layer of second conductivity type on a silicon carbide collector layer of first conductivity type different from the second conductivity type, and epitaxially growing a silicon carbide emitter mesa of the first conductivity type on the silicon carbide base layer. A silicon carbide passivation layer of the first conductivity type is epitaxially grown on at least a portion of the silicon carbide base layer outside the silicon carbide emitter mesa. Any or all of these epitaxial growths may employ blanket growth, blanket growth followed by selective etching, and/or selective epitaxial growth. In some embodiments, the carrier concentration and/or thickness of the silicon carbide passivation layer may be provided as was described above. Moreover, the extent of the silicon carbide passivation layer may be provided as was described in any of the above embodiments.

In still other embodiments of the invention, a region of higher carrier concentration than the silicon carbide base region is implanted in the silicon carbide base layer, and spaced apart from the emitter mesa, and the silicon carbide passivation layer is epitaxially grown to extend on the silicon carbide base layer from adjacent the silicon carbide emitter mesa to the region that is implanted. In still other embodiments, a base mesa of the second conductivity type is epitaxially grown on the silicon carbide base layer and spaced apart from the emitter mesa, and the silicon carbide passivation layer is epitaxially grown to extend on the epitaxial silicon carbide base layer from adjacent the silicon carbide emitter mesa to adjacent but spaced apart from the base mesa. A dielectric passivation layer may be formed on the silicon carbide passivation layer.

Accordingly, bipolar junction transistors according to some embodiments of the present invention can include a silicon carbide substrate that includes emitter, base and collector regions and an epitaxial silicon carbide passivation layer of opposite conductivity type from the base region, on at least a portion of the base region. The epitaxial silicon carbide passivation layer can be configured to fully deplete at zero bias on the bipolar junction transistor. A dielectric passivation layer also may be provided on the silicon carbide passivation layer remote from the base region. The extent of the silicon carbide passivation layer may be as was described above.

DETAILED DESCRIPTION

Figure 1:
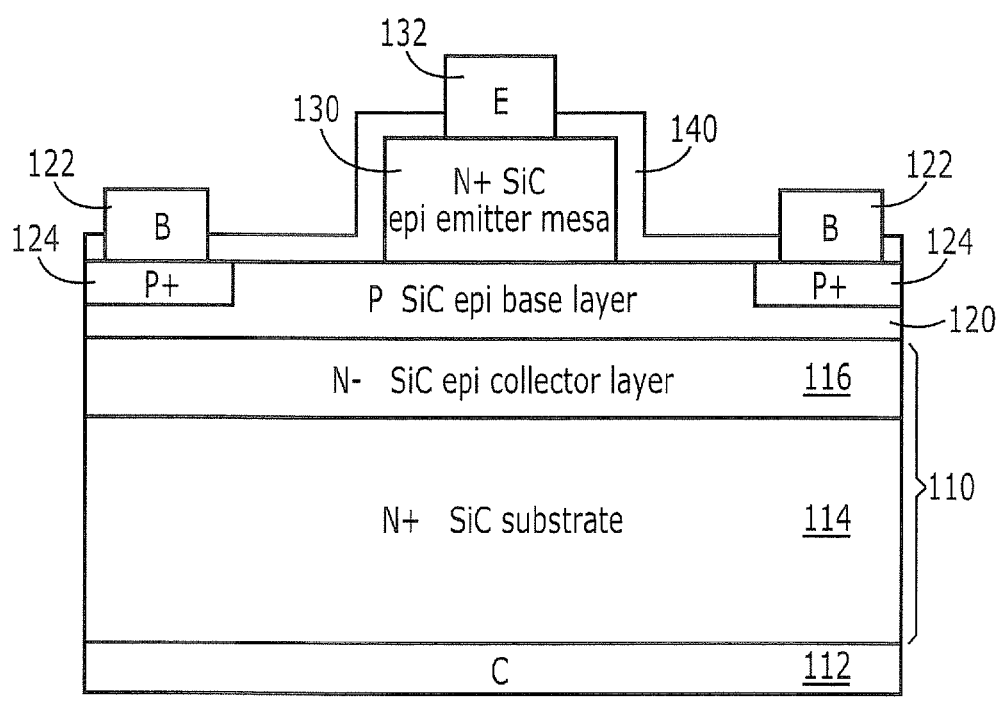
FIG. 1 is a cross-sectional view of a silicon carbide (SiC) bipolar junction transistor (BJT).
Figure 2A:
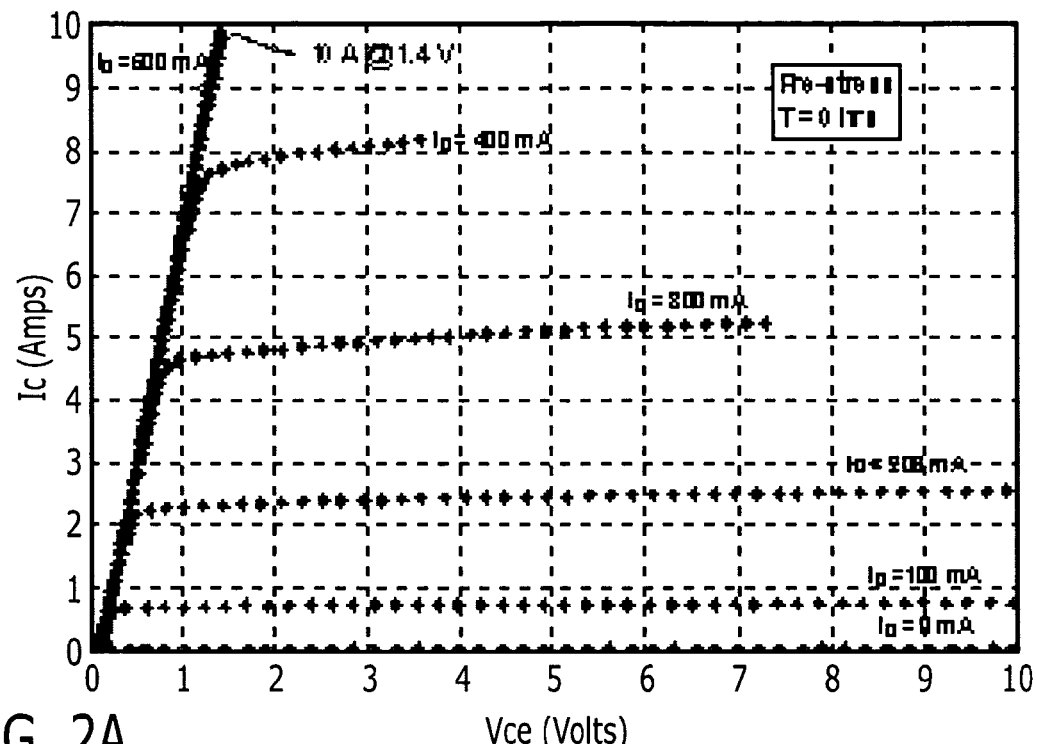
FIGS. 2A-2D graphically illustrate degradation of current gain of conventional SiC BJTs over time.
Figure 2B:
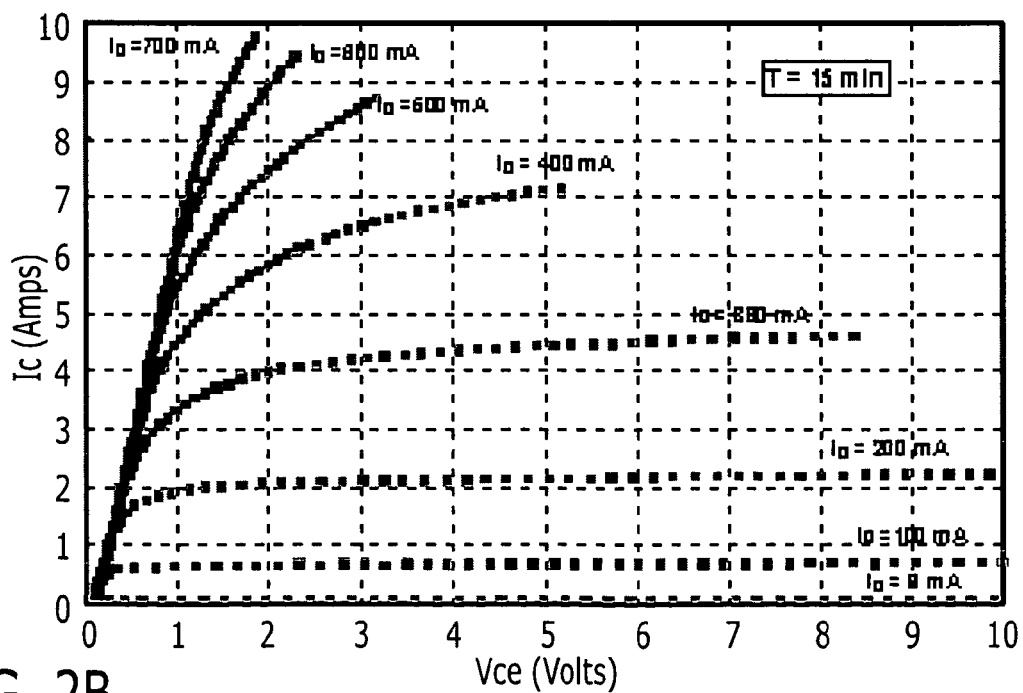
Figure 2C:
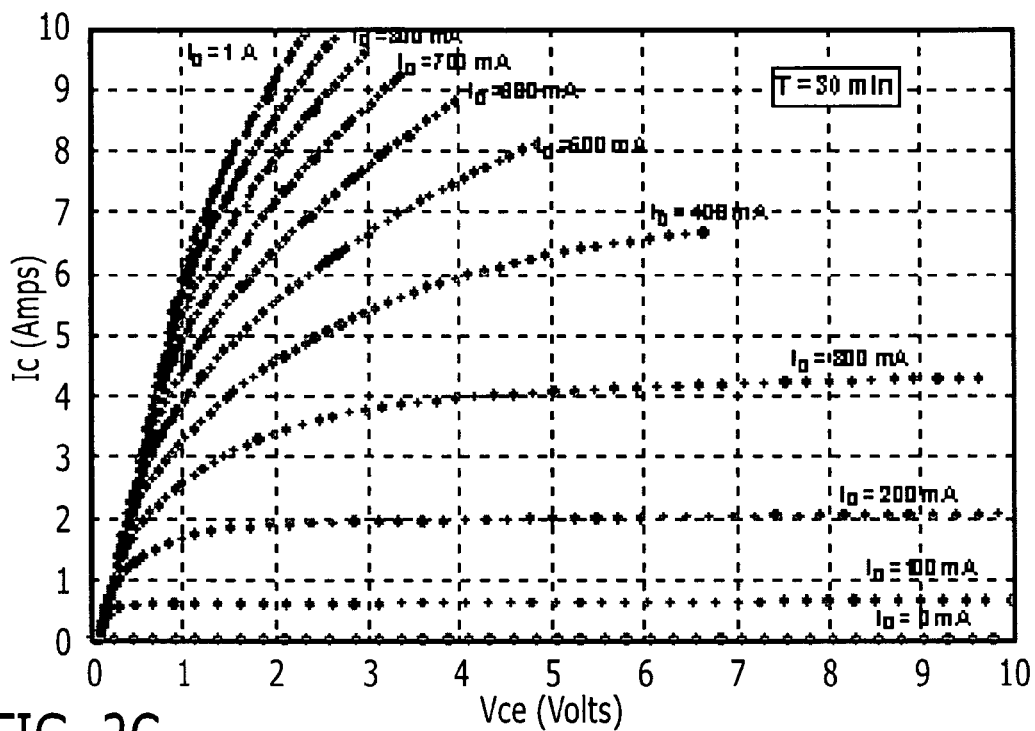
Figure 2D:
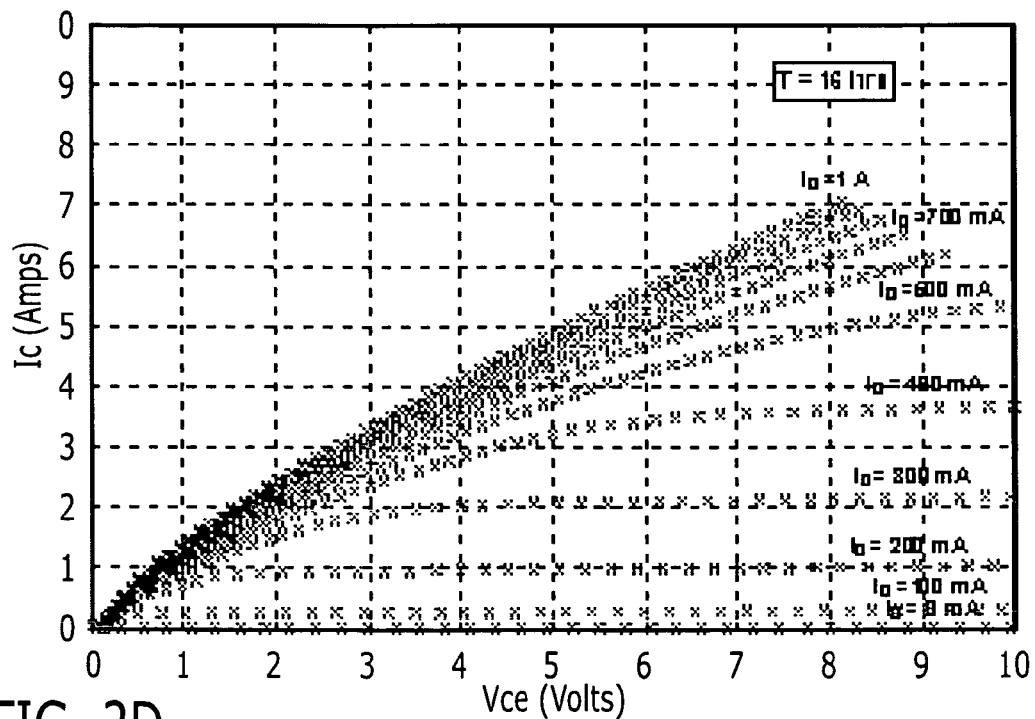

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending on the particular orientation of the figure. Similarly, if the device in one of the Figures is turned over, elements described as "below" or "beneath" other elements would then be oriented "above" the other elements. The exemplary terms "below" or "beneath" can, therefore, encompass both an orientation of above and below.

As used herein, the term "adjacent" means an element extends near another element and includes closely spaced apart from, touching and/or overlapping the other element. In contrast, when an element is described as extending "to" or "from" another element, it means the element actually touches or overlaps with the other element, and excludes the elements being spaced apart from one another.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present specification, and will not be interpreted in an idealized or overly formal sense unless expressly so defined herein.

Embodiments of the present invention are described with reference to a particular polarity conductivity type for various layers/regions. However, as will be appreciated by those of skill in the art, the polarity of the regions/layers may be inverted to provide an opposite polarity device. For example, the terms "first conductivity type" and "second conductivity type" refer to opposite conductivity types such as n or p-type, however, each embodiment described and illustrated herein includes its complementary embodiment as well.

In particular, BJTs are active, three terminal semiconductor devices including two back-to-back p-n junctions in close proximity. BJT's are broadly characterized as n-p-n or p-n-p depending on the conductivity types of their respective bases, collectors, and emitters. It will be understood that although only n-p-n BJTs will be discussed herein, embodiments of the present invention are not limited to this configuration. For example, p-n-p transistors may also be provided by reversing the described conductivity types without departing from the scope of the present invention. Moreover, BJT structures illustrated herein may be repeated to provide a power device, so that the structures illustrated herein can provide an entire power device or a unit cell for a power device.

As is known to those of skill in the art, doped regions of silicon carbide may be formed through epitaxial growth and/or through implantation. For example, a p-type region of silicon carbide may be formed through epitaxial growth in the presence of a p-type dopant or through implantation of p-type dopants in an undoped, p-type or n-type epitaxial layer. The structure that results from epitaxial growth differs from that that results from implantation. Thus, the terms "epitaxial layer/region" and "implanted layer/region" structurally distinguish differing layers/regions of silicon carbide and may be used herein as a recitation of structural characteristics of the layer/regions of silicon carbide and/or as recitations of methods of forming such layers/regions of silicon carbide. The fabrication of epitaxial layers of SiC is discussed in, for example, U.S. Pat. Nos. 5,011,549 and 4,912,064 to Kong et al., the disclosures of which are hereby incorporated herein by reference as if set forth in their entirety.

Some embodiments of the present invention provide bipolar junction transistors (BJTs) having epitaxial silicon carbide (SiC) base regions and multilayer epitaxial emitter regions. The use of an epitaxial SiC base region in BJTs according to some embodiments of the present invention may eliminate the need for implantation and a subsequent high temperature anneal, which may cause damage to the SiC crystal and, thereby, cause a reduction in the current gain of the device. Accordingly, BJTs according to some embodiments of the present invention may have improved current gains relative to conventional devices. Furthermore, the use of a multilayer epitaxial SiC emitter region may allow the current gain of the device to be further increased. However, other embodiments of the present invention can use a single layer epitaxial emitter region and/or an implanted high conductivity base region.

Figure 3:
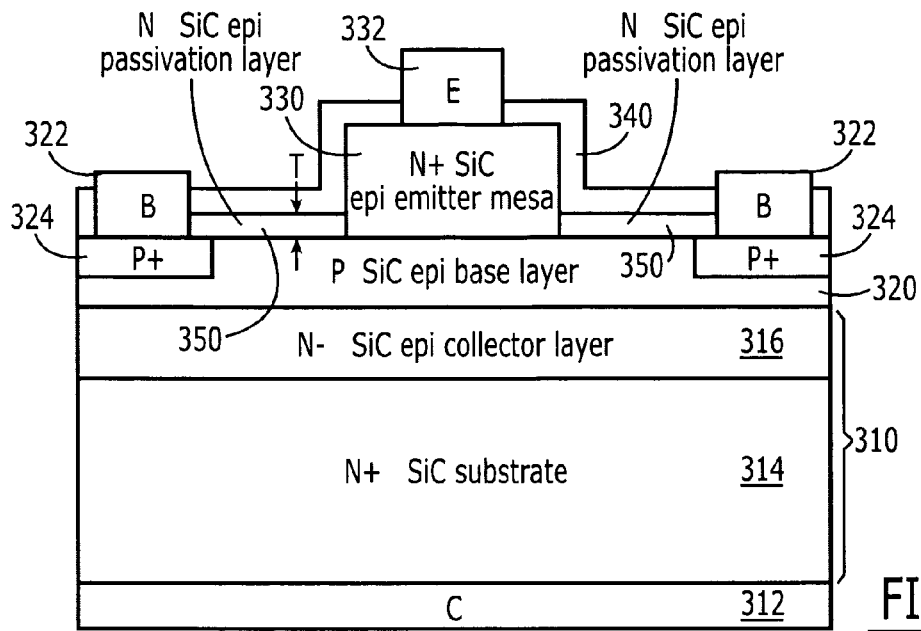
FIG. 3 is a cross-sectional view of SiC BJTs according to various embodiments of the present invention.

Referring now to FIG. 3, a cross section of a BJT according to some embodiments of the present invention will be discussed. As illustrated in FIG. 3, a silicon carbide (SiC) substrate 314 may be provided. The polarity of the substrate 314 may be n-type or p-type SiC having a polytype of, for example, 3C, 2H, 4H, 6H or 15R. For exemplary purposes only, devices discussed according to embodiments of the present invention illustrated in FIG. 3 include n-type SiC substrates 314. As illustrated in FIG. 3, the substrate 314 is a highly doped n-type SiC (N$^+$). As used herein, "P$^+$" or "N$^+$" refer to regions that are defined by higher carrier concentrations than are present in adjacent or other regions of the same or another layer or substrate. Similarly, "P$^-$" or "N$^-$" refer to regions that are defined by lower carrier concentrations than are present in adjacent or other regions of the same or another layer. The substrate 314 may be doped with n-type dopants, such as nitrogen. The substrate may have a carrier concentration of from about $1.0\times10^{18}$ cm$^{-3}$ to about $5.0\times10^{19}$ cm$^{-3}$ and a thickness of from about 200 μm to about 500 μm.

As further illustrated in FIG. 3, an epitaxial collector layer 316 is provided on the SiC substrate 314. The epitaxial collector layer 316 may be doped with n-type dopants, such as nitrogen. The epitaxial collector layer 316 may have a carrier concentration of from about $1.0\times10^{13}$ cm$^{-3}$ to about $1.0\times10^{18}$ cm$^{-3}$ and a thickness of from about 1.0 μm to about 250 μm. The substrate 314 and the epitaxial SiC collector layer 316 can provide the collector (C) 310 of the BJT. However, in other embodiments, a non-conducting substrate may be used, and the collector layer 316 can provide the collector. An epitaxial base layer 320 is provided on the epitaxial collector layer 316 and may be doped with p-type dopants, such as aluminum or boron. The epitaxial base layer 320 may have a carrier concentration of from about $1.0\times10^{15}$ cm$^{-3}$ to about $5.0\times10^{19}$ cm$^{-3}$ and a thickness of from about 0.1 μm to about 10 μm.

In some embodiments, an implanted and/or epitaxial SiC base contact region 324 is provided in and/or on the epitaxial base layer 320. As illustrated in FIG. 3, the SiC base contact region 324 may be implanted in the silicon carbide epitaxial base layer 320. However, in other embodiments, the SiC base contact region 324 may be epitaxially grown on the SiC epitaxial base layer 320 remote from the SiC epitaxial collector layer 316. In some embodiments, an implanted SiC base contact region 324 can include nonuniform carrier concentration therein. Moreover, in other embodiments, a relatively uniform concentration as illustrated in FIG. 3 may be provided.

In still other embodiments, an epitaxial silicon carbide base contact region can be grown on the silicon carbide epitaxial base layer 320, as will be described in detail below. In some embodiments, the epitaxial silicon carbide base contact region can include a single layer. Moreover, in other embodiments, the epitaxial SiC base contact region can include a first p-type epitaxial SiC region on the epitaxial base layer 320 and a second p-type epitaxial SiC region on the first p-type epitaxial SiC region. In some embodiments, the first p-type epitaxial SiC region has a carrier concentration of from about $1.0\times10^{18}$ cm$^{-3}$ to about $1.0\times10^{19}$ cm$^{-3}$ and a thickness of from about 0.1 μm to about 10 μm. The second p-type epitaxial SiC region has a carrier concentration of from about $1.0\times10^{19}$ cm$^{-3}$ to about $5.0\times10^{20}$ cm$^{-3}$ and a thickness of from about 0.1 μm to about 3.0 μm. The epitaxial base layer 320 and the implanted/epitaxial SiC base contact region can provide the base (B) region of the BJT according to some embodiments of the present invention. Moreover, in other embodiments, the SiC base contact region can be a single p-type region, and in still other embodiments, the base contact region need not be provided at all.

As further illustrated in FIG. 3, an epitaxial SiC emitter mesa 330 is provided on the epitaxial base layer 320. As illustrated, the epitaxial SiC emitter mesa 330 has an n-type conductivity. In some embodiments, the epitaxial SiC emitter mesa 330 has first (N) and second (N+) portions, respectively. In these embodiments, the first portion of the epitaxial SiC emitter mesa can be provided on the epitaxial base layer 320 and can be doped with n-type dopants, such as nitrogen. The first portion of the epitaxial SiC emitter mesa 330 can have a carrier concentration of from about $1.0 \times 10^{17}$ cm$^{-3}$ to about $5 \times 10^{19}$ cm$^{-3}$ and a thickness of from about 0.1 µm to about 5.0 µm. The second portion of the epitaxial SiC emitter mesa 330 can be doped with n-type dopants, such as nitrogen, and can have a higher carrier concentration relative to the first portion. In particular, the second portion 105 of the epitaxial SiC emitter region can have a carrier concentration of from about $5 \times 10^{18}$ cm$^{-3}$ to about $5 \times 10^{20}$ cm$^{-3}$ and a thickness of from about 0.1 µm to about 3.0 µm. Thus, according to some embodiments of the present invention, the epitaxial SiC emitter mesa 330 includes a low-doped n-type layer that may provide improved injection efficiency and a highly doped n-type layer that may provide an improved contact surface. However, in other embodiments, the epitaxial silicon carbide emitter mesa 330 may include a single region as illustrated in FIG. 3. The epitaxial silicon carbide emitter mesa 330 may be fabricated by blanket epitaxy and etching and/or by selective epitaxial growth.

It will be understood that although embodiments of the present invention illustrated in FIG. 3 include both the implanted/epitaxial SiC base region 324 and the epitaxial SiC emitter mesa 330, embodiments of the present invention are not limited to this configuration. For example, the epitaxial SiC emitter region having first (N) and second (N+) portions may be provided without the epitaxial SiC base region according to some embodiments of the present invention.

Other detailed design and fabrication aspects of SiC BJTs of FIG. 3, as heretofore described in this Detailed Description, are provided in application Ser. No. 11/229,474, filed Sep. 16, 2005, to Agarwal et al., entitled *Silicon Carbide Bipolar Junction Transistors Having Epitaxial Base Regions and Multilayer Emitters and Methods of Fabricating the Same*, the disclosure of which is hereby incorporated herein by reference in its entirety as if set forth fully herein.

Figure 4:
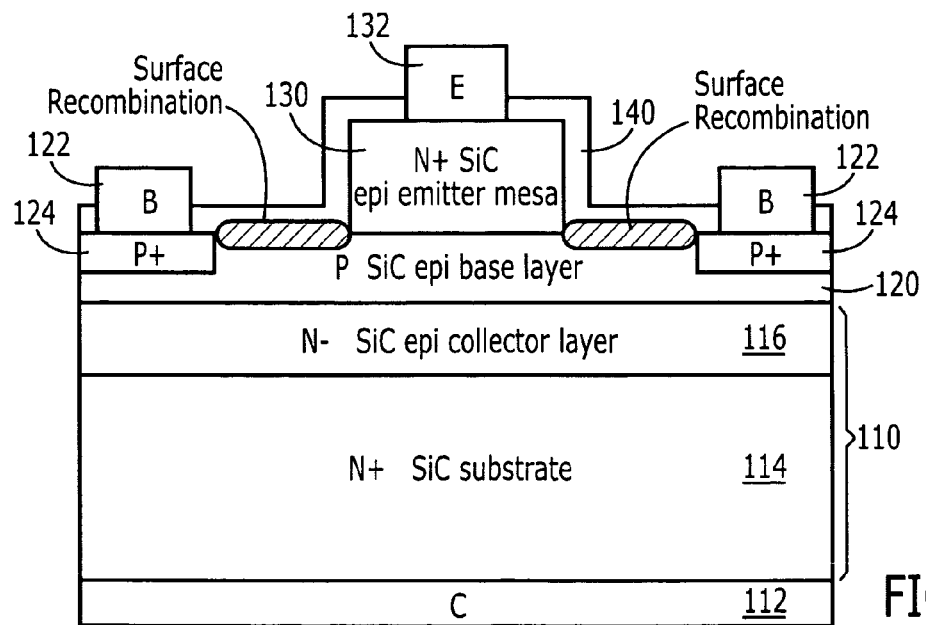
FIG. 4 is a cross-sectional view of an SiC BJT illustrating a potential source of current gain degradation.

Still referring to FIG. 3, an N-type epitaxial silicon carbide passivation layer 350 is provided on at least a portion of the epitaxial silicon carbide base layer 320 outside the silicon carbide emitter mesa 330. The epitaxial silicon carbide passivation layer 350 may be regarded as extending on the at least a portion of the outer surface of the silicon carbide base layer 320, outside the silicon carbide emitter mesa 330. Without wishing to be bound by any theory of operation, the current gain degradation that was shown in FIGS. 2A-2D may occur due to an increase in the surface recombination, as shown in FIG. 4, between the base 120 and emitter 130 that are already passivated by a dielectric passivation layer 140, such as a thermally grown silicon dioxide followed by a deposited/densified silicon dioxide layer. The surface recombination may occur due to the interface traps created at the silicon carbide/silicon dioxide interface.

In sharp contrast, as illustrated in FIG. 3, embodiments of the present invention can provide an epitaxial silicon carbide passivation layer of the first conductivity type on at least a portion of the epitaxial silicon carbide base region of the second conductivity type. In some embodiments, the total charge in this passivation layer 350 may be chosen, such that the silicon carbide passivation layer 350 is fully depleted at zero device bias, due to the built in potential of about 2.7 volts. This epitaxial silicon carbide surface passivation layer 350 can help reduce or suppress the surface combination. The degradation in the current gain shown in FIGS. 2A-2D consequently may be stopped or sufficiently reduced. In some embodiments of the present invention, the epitaxial silicon carbide passivation layer of the first conductivity type has a carrier concentration C of the first conductivity type (here n-type), and is of a thickness T that is selected according to the following equation:

$$\frac{qCT^2}{2\varepsilon_s} \leq 2.7,$$

where q is the elementary charge ($1.6 \times 10^{-19}$ coulombs), and $\varepsilon_s$ is the permittivity of silicon carbide.

Continuing with the description of FIG. 3, a dielectric passivation layer 340 is provided on the base layer 320 on the silicon carbide passivation layer 350, and/or on the epitaxial emitter mesa 330. The dielectric passivation layer 340 may include, for example, thermally grown silicon dioxide (SiO$_2$), chemical vapor deposited SiO$_2$ and/or chemical vapor deposited silicon nitride (Si$_3$N$_4$). Ohmic metal(s), suitable for n-type silicon carbide, may be provided on the emitter mesa 330. The ohmic metals may be annealed to provide ohmic contacts as discussed further below. Some embodiments of the present invention include conductive substrates 314. In these embodiments of the present invention, ohmic metal also may be provided on substrate 314 remote from the epitaxial collector layer 316. It will be understood by those skilled in the art that the present invention may be implemented using a non-conducting substrate, such as semi-insulating silicon carbide or sapphire, in which case the ohmic metal for the collector may be provided on a surface of the SiC collector layer 316.

Ohmic metal, suitable for p-type silicon carbide, also may be provided on the base layer 320. Metals and/or metal composites may be appropriate for the ohmic contacts. For example, nickel or nickel-titanium combinations are appropriate ohmic contacts to n-type silicon carbide while aluminum or aluminum-titanium combinations are appropriate ohmic contacts to p-type silicon carbide. Furthermore, cobalt silicide (CoSi$_2$) may also be used as an ohmic contact material to p-type silicon carbide. Ohmic contacts are discussed in U.S. Pat. Nos. 5,323,022 and 5,409,859, the disclosures of which are incorporated herein by reference as if set forth in their entirety. An overlayer metal, such as gold, also may be deposited on the ohmic contacts, to provide emitter, base and collector contacts 332, 322 and 312, respectively. Example designs of the dielectric passivation layer 340 and of the contacts 312, 322 and 332, are described, for example, in the above-cited application Ser. No. 11/229,474.

As used herein the term "ohmic contact" refers to contacts where an impedance associated therewith is substantially given by the relationship of Impedance=V/I, where V is a voltage across the contact and I is the current, at substantially all expected operating frequencies (i.e., the impedance associated with the ohmic contact is substantially the same at all operating frequencies) and currents.

Figure 5:
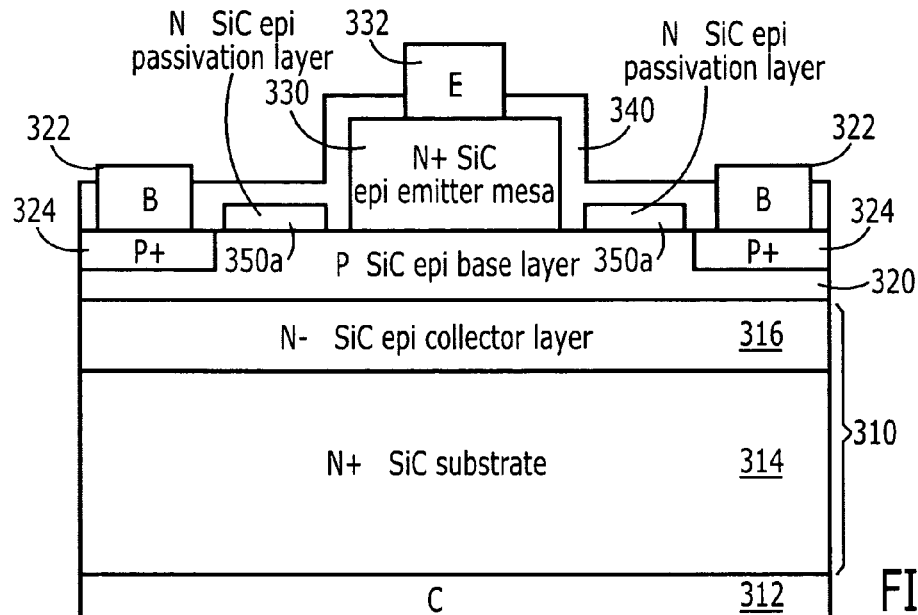
FIGS. 5-10 are cross-sectional views of SiC BJTs according to various embodiments of the present invention.
Figure 6:
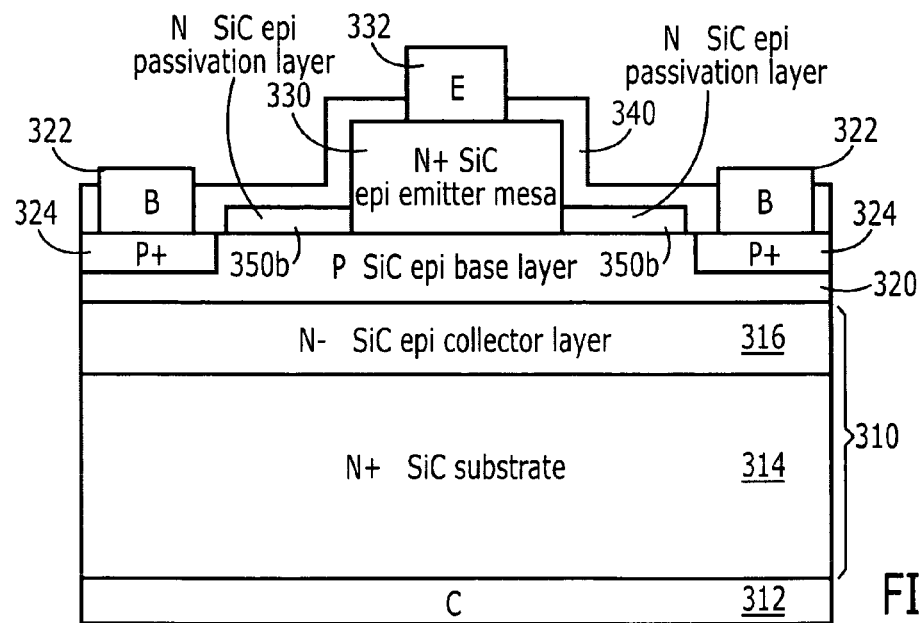

The extent of the epitaxial silicon carbide passivation layer 350 of FIG. 3 may be varied according to various embodiments of the present invention. In particular, in FIG. 3, the epitaxial silicon carbide passivation layer 350 extends on the epitaxial silicon carbide base layer 320 from the epitaxial silicon carbide emitter mesa 330 to the base contact 322. In contrast, in FIG. 5, the epitaxial silicon carbide passivation layer 350a extends adjacent, but spaced apart from, the silicon carbide emitter mesa 330, and also extends adjacent, but spaced apart from, the base contact 322. In FIG. 6, the epitaxial silicon carbide passivation layer extends to the silicon carbide emitter mesa 330, but extends adjacent and spaced apart from the base contact 322. In other embodiments, not shown, the epitaxial silicon carbide passivation layer 350b can extend adjacent, but spaced apart from, the silicon carbide emitter mesa 330, and to the base contact 322.

Figure 7:
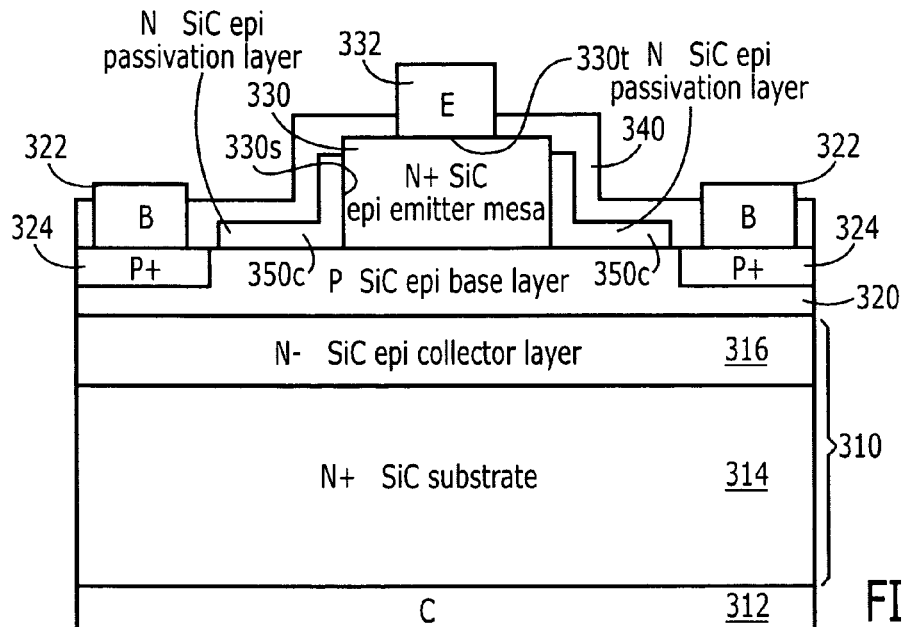
Figure 8:
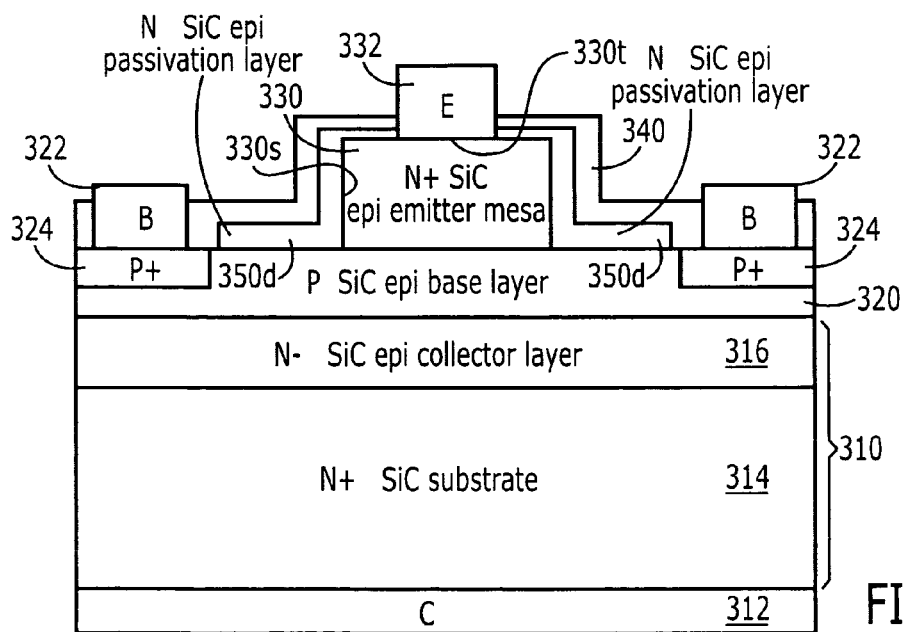

Moreover, in embodiments of FIG. 7, the epitaxial silicon carbide passivation layer 350c extends at least partially on the sidewall 330s of the silicon carbide emitter mesa 330, but not onto the top 330t of the emitter mesa 330. Finally, as illustrated in FIG. 8, the epitaxial silicon carbide passivation layer 350d may also extend onto the mesa top 330t, in addition to or instead of the mesa sidewall 320s. It will also be understood that combinations and subcombinations of the embodiments shown in FIGS. 3 and 5-8 and/or other extents of the silicon carbide passivation layer may be provided according to some embodiments of the present invention.

The epitaxial silicon carbide passivation layers 350 and 350a-350d may be fabricated using epitaxial deposition (blanket and/or selective) and may be doped the first conductivity type at a concentration C and a thickness T that fully depletes the epitaxial silicon carbide passivation layer by the epitaxial silicon carbide base layer 320 at zero device bias. When the other layers of the SiC BJT have the thicknesses and doping as concentrations described above, the silicon carbide passivation layers 350 and 350a-350d may be about 0.51 µm thick and have an n-type doping concentration up to about $1 \times 10^{16}$ cm$^{-3}$. In other embodiments, a thickness of about 2 µm and a n-type concentration up to about $8 \times 10^{14}$ cm$^{-3}$ may be provided. Thus, thinner layers may be more highly doped and vice versa, so as to satisfy the above equation and/or to fully deplete the silicon carbide passivation layer.

Figure 9:
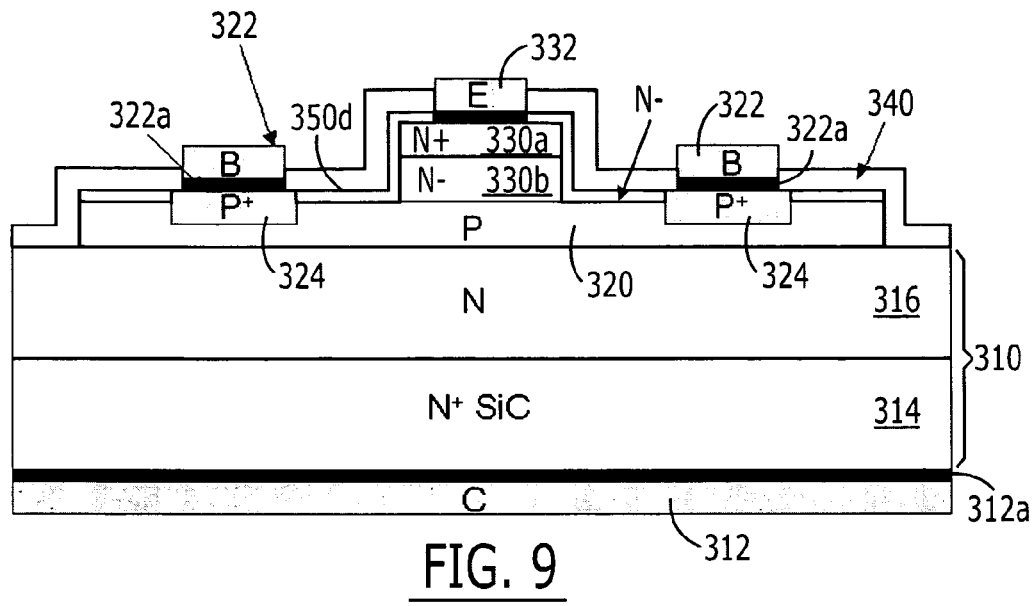

FIG. 9 is a cross-sectional view of SiC BJTs according to still other embodiments of the present invention. Comparing FIGS. 8 and 9, a multilayer epitaxial silicon carbide emitter mesa 330a, 330b is provided, as was described above. Moreover, ohmic contact layers 322a, 332a and 312a for the base 322, emitter 332 and collector 312 contacts, respectively, are also provided, as was described above. As also shown in FIG. 9, the epitaxial silicon carbide layer 350d extends to the high conductivity implanted base contact region 324, but not to the base ohmic contact region 322a or to the base contact metal 322. It will be understood that embodiments of FIG. 9 may be combined with any or all of the other embodiments described herein.

Figure 10:
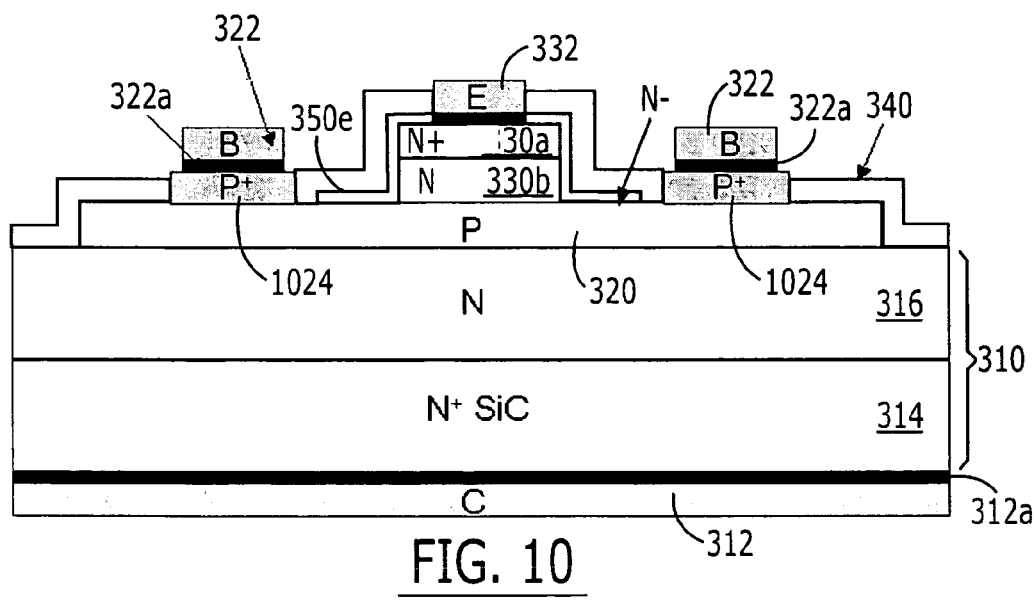

FIG. 10 is a cross-sectional view of an SiC BJT according to still other embodiments of the present invention. In these embodiments, a high conductivity (P$^+$) base contact region is epitaxially grown on the base layer 320, to provide an epitaxial base mesa 1024 that is spaced apart from the emitter mesa 330. The base mesa 1024 may include a single layer, shown as P$^+$ in FIG. 10, or may include a plurality of layers, such as a relatively low conductivity (P) layer adjacent the base layer 320 and a relatively high conductivity (P$^+$) layer on the relatively low conductivity layer remote from the base region 320, as was described above and in the above-cited application Ser. No. 11/229,474. Moreover, in FIG. 10, the epitaxial silicon carbide passivation layer 350e is shown extending on the sidewall and top of the emitter mesa, and on the base layer 320 adjacent but spaced apart from the base mesa 1024. However, in other embodiments, the epitaxial silicon carbide layer 350e need not be pulled back from the base mesa 1024. It will be understood that embodiments of FIG. 10 may be combined with any or all of the other embodiments described herein.

Figure 11:
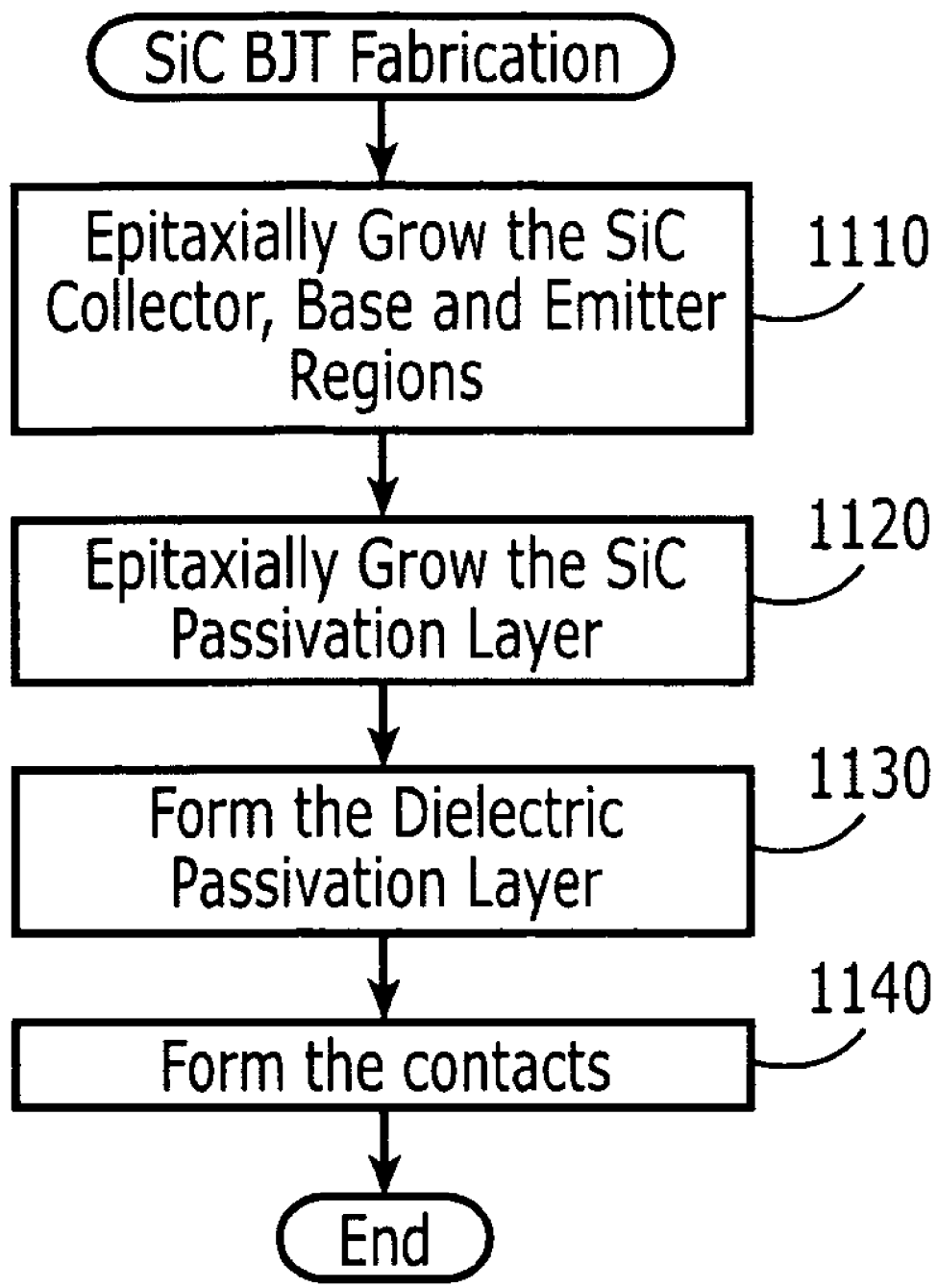
FIG. 11 is a flowchart of operations that may be performed to fabricate SiC BJTs according to various embodiments of the present invention.

FIG. 11 is a flowchart of operations that may be performed to fabricate SiC BJTs according to various embodiments of the present invention. Referring to FIG. 11, at Block 1110, the silicon carbide collector, base and emitter layers are epitaxially grown. For example, an N$^-$ silicon carbide epitaxial collector layer 316 may be epitaxially grown on an N$^+$ silicon carbide substrate 314, and a P silicon carbide epitaxial base layer 320 may be grown on the N$^-$ silicon carbide epitaxial collector layer 316, as was illustrated above. An emitter mesa and/or a base mesa may be epitaxially grown. The epitaxial growth of silicon carbide collector, base and emitter layers of Block 1110 is known to those having skill in the art and need not be described further herein.

Then, referring to Block 1120, the silicon carbide passivation layer 350 and 350a-350e is epitaxially grown. Blanket epitaxy may be used in some embodiments. In other embodiments, conditions may be set to cause epitaxy to proceed more favorably on horizontal surfaces than on vertical surfaces. In still other embodiments, selective epitaxial deposition may take place by masking regions where it is not desired to perform epitaxial growth using a mask of, for example, TaC, and/or other known masking materials. In any of these embodiments, selective etching also may be used. The doping concentration and thickness of the SiC passivation layer may be selected as was described above.

Then, at Block 1130, the dielectric passivation layer 340 may be formed using techniques known to those having skill in the art, and at Block 1140, the contacts are formed. It will also be understood that the operations of Blocks 1110-1140 may be performed out of the order shown in FIG. 11. For example, the contacts (Block 1140) may be formed prior to forming the dielectric passivation layer (Block 1130). Moreover, in other embodiments, the operations of Blocks 1130 and/or 1140 may be performed prior to the operations of Block 1120.

Accordingly, BJTs according to some embodiments of the present invention can provide a silicon carbide structure that includes emitter, base and collector regions, and a silicon carbide passivation layer of opposite conductivity type from the base region on at least a portion of the base region. It is known that the surface of a silicon carbide layer may be passivated by forming a silicon dioxide layer thereon, which can reduce interface states with energy levels near the conduction band of silicon carbide. Some techniques for fabricating oxide layers on silicon carbide layers are described in application Ser. No. 11/229,476, filed Sep. 16, 2005 to Das et al., entitled *Ultra-Thin Ohmic Contacts For P-Type Nitride Light Emitting Devices And Methods of Forming*, the disclosure of which is hereby incorporated herein by reference in its entirety as if set forth fully herein. Yet, it has been found, according to some embodiments of the present invention, that it may be desirable to provide an epitaxial silicon carbide passivation layer instead of or in addition to a dielectric silicon carbide passivation layer, to allow further suppression of surface recombination, thereby reducing or eliminating undesirable degradation in current gain over time. Gallium arsenide (GaAs) based heterojunction bipolar transistors (HBTs) have used emitter ledges to suppress current gain degradation. However, GaAs HBT emitter ledge technology may differ considerably from a materials, structural and/or fabrication standpoint from embodiments of the present invention.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A Bipolar Junction Transistor (BJT) comprising:
a silicon carbide collector layer of first conductivity type;
an epitaxial silicon carbide base layer of second conductivity type, different than the first conductivity type, on the silicon carbide collector layer;
an epitaxial silicon carbide emitter mesa of the first conductivity type on the epitaxial silicon carbide base layer remote from the silicon carbide collector layer; and
an epitaxial silicon carbide passivation layer of the first conductivity type on at least a portion of the epitaxial silicon carbide base layer outside the silicon carbide emitter mesa.

2. A BJT according to claim 1 wherein the epitaxial silicon carbide passivation layer of the first conductivity type has a carrier concentration of the first conductivity type and is of a thickness that are selected to fully deplete the epitaxial silicon carbide passivation layer by the epitaxial silicon carbide base layer at zero bias on the BJT.

3. A BJT according to claim 1 wherein the epitaxial silicon carbide passivation layer of the first conductivity type has a carrier concentration C of the first conductivity type and is of a thickness T that are selected according to the following equation:

$$\frac{qCT^2}{2\varepsilon_s} \leq 2.7;$$

where q is the elementary charge, and $\varepsilon_s$ is the permittivity of silicon carbide.

4. A BJT according to claim 1 wherein the epitaxial silicon carbide emitter mesa includes a top that is remote from the epitaxial silicon carbide base layer and a sidewall that extends between the top and the epitaxial silicon carbide base layer and wherein the epitaxial silicon carbide passivation layer extends on a least a portion of the epitaxial silicon carbide base layer outside the silicon carbide emitter mesa but not on the sidewall.

5. A BJT according to claim 1 wherein the epitaxial silicon carbide emitter mesa includes a top that is remote from the epitaxial silicon carbide base layer and a sidewall that extends between the top and the epitaxial silicon carbide base layer and wherein the epitaxial silicon carbide passivation layer extends on a least a portion of the epitaxial silicon carbide base layer outside the silicon carbide emitter mesa and on the sidewall but not on the top.

6. A BJT according to claim 1 wherein the epitaxial silicon carbide emitter mesa includes a top that is remote from the epitaxial silicon carbide base layer and a sidewall that extends between the top and the epitaxial silicon carbide base layer and wherein the epitaxial silicon carbide passivation layer extends on a least a portion of the epitaxial silicon carbide base layer outside the silicon carbide emitter mesa, on the sidewall and on the top.

7. A BJT according to claim 1 wherein the epitaxial silicon carbide base layer includes a first portion and a second portion of higher carrier concentration than the first portion that is spaced apart from the emitter mesa, and wherein the epitaxial silicon carbide passivation layer extends on the epitaxial silicon carbide base layer from adjacent the silicon carbide emitter mesa to adjacent the second portion.

8. A BJT according to claim 1 wherein the epitaxial silicon carbide base layer includes a first portion and a second portion of higher carrier concentration than the first portion that is spaced apart from the emitter mesa, and wherein the epitaxial silicon carbide passivation layer extends on the epitaxial silicon carbide base layer from adjacent the silicon carbide emitter mesa to the second portion.

9. A BJT according to claim 1 wherein the epitaxial silicon carbide base layer includes a first portion and a second portion of higher carrier concentration than the first portion that is spaced apart from the emitter mesa, and wherein the epitaxial silicon carbide passivation layer extends on the epitaxial silicon carbide base layer from the silicon carbide emitter mesa to adjacent the second portion.

10. A BJT according to claim 1 wherein the epitaxial silicon carbide base layer includes a first portion and a second portion of higher carrier concentration than the first portion that is spaced apart from the emitter mesa, and wherein the epitaxial silicon carbide passivation layer extends on the epitaxial silicon carbide base layer from the silicon carbide emitter mesa to the second portion.

11. A BJT according to claim 1 wherein the epitaxial silicon carbide base layer includes a first portion and an implant of higher carrier concentration than the first portion in the first portion and spaced apart from the emitter mesa, and wherein the epitaxial silicon carbide passivation layer extends on the epitaxial silicon carbide base layer from adjacent the silicon carbide emitter mesa to the implant.

12. A BJT according to claim 1 further comprising an epitaxial base mesa on the epitaxial silicon carbide base layer that is spaced apart from the emitter mesa, and wherein the epitaxial silicon carbide passivation layer extends on the epitaxial silicon carbide base layer from adjacent the silicon carbide emitter mesa to adjacent, but spaced apart from, the base mesa.

13. A BJT according to claim 1 further comprising a dielectric passivation layer on the epitaxial silicon carbide passivation layer of the second conductivity type remote from the epitaxial silicon carbide base layer.

14. A BJT according to claim 13 wherein the dielectric passivation layer comprises silicon dioxide.

15. A BJT according to claim 1 wherein the epitaxial silicon carbide emitter mesa comprises a first portion adjacent the epitaxial silicon carbide base layer and a second portion on the first portion and remote from the epitaxial silicon carbide base layer, wherein the second portion has higher carrier concentration than the first portion.

16. A BJT according to claim 1 further comprising:
a silicon carbide substrate of the first conductivity type on the silicon carbide collector layer;
a collector contact on the silicon carbide substrate;
a base contact on the epitaxial silicon carbide base layer; and
an emitter contact on the epitaxial silicon carbide emitter mesa.

* * * * *